(12) United States Patent
Liou et al.

(10) Patent No.: US 7,067,917 B2
(45) Date of Patent: Jun. 27, 2006

(54) GRADIENT BARRIER LAYER FOR COPPER BACK-END-OF-LINE TECHNOLOGY

(75) Inventors: Fu-Tai Liou, Hsin-Chu (TW); Cheng-Yu Hung, Taipei (TW); Tri-Rung Yew, Hsin-Chu (TW)

(73) Assignee: United Microelectronics Corp., Hsin Chu (TW)

( * ) Notice: Subject to any disclaimer, the term of this patent is extended or adjusted under 35 U.S.C. 154(b) by 87 days.

(21) Appl. No.: 10/337,292

(22) Filed: Jan. 7, 2003

(65) Prior Publication Data

US 2003/0186541 A1 Oct. 2, 2003

Related U.S. Application Data

(62) Division of application No. 10/105,521, filed on Mar. 26, 2002.

(51) Int. Cl.
*H01L 23/48* (2006.01)
*H01L 23/52* (2006.01)
*H01L 29/40* (2006.01)

(52) U.S. Cl. .................. 257/751; 257/761; 257/762; 257/763; 257/764

(58) Field of Classification Search .............. 257/764, 257/751, 761, 763, 762; 438/627, 643, 653, 438/648, 656, 685
See application file for complete search history.

(56) References Cited

U.S. PATENT DOCUMENTS

| 5,391,517 A | * | 2/1995 | Gelatos et al. | 438/643 |
| 6,194,310 B1 | * | 2/2001 | Hsu et al. | 438/643 |
| 6,346,745 B1 | * | 2/2002 | Nogami et al. | 257/751 |

* cited by examiner

*Primary Examiner*—Ha Tran Nguyen
(74) *Attorney, Agent, or Firm*—Dickinson Wright PLLC

(57) ABSTRACT

The present invention is directed to a structure of a gradient barrier layer. The gradient barrier with a composite structure of metal/metal salt of different composition/metal such as $Ta/Ta_xN_{1-x}/TaN/Ta_xN_{1-x}/Ta$ (tantalum/tantalum$_x$ nitride$_{1-x}$/tantalum nitride/tantalum$_x$ nitride$_{1-x}$/tantalum) is proposed to replace the conventional barrier for copper metallization. The gradient barrier can be formed in a chemical vapor deposition (CVD) process or a multi-target physical vapor deposition (PVD) process. For CVD process, using the characteristics of well-controlled reaction gas injection, the ratio of tantalum (Ta) and nitrogen (N) can be modulated gradually to form the gradient barrier. For the multi-target PVD process, the gradient barrier is formed by depositing multi-layers of different composition $Ta_xN_{1-x}$ films. After subsequent thermal cycle processes such as metal alloy, the inter-layer diffusion occurs and a more smooth distribution of Ta and N is achieved for the gradient barrier. The advantages of forming the gradient barrier include a well-controlled process, a strong adhesion between via and landing metal, more uniform step coverage, and less brittle to reduce crack.

11 Claims, 4 Drawing Sheets

GRADIENT BARRIER LAYER FOR COPPER BACK-END-OF-LINE TECHNOLOGY

This is a division of U.S. patent application Ser. No. 10/105,521, filed Mar. 26, 2002.

BACKGROUND OF THE INVENTION

1. Field of the Invention

The present invention generally relates to a method for forming a gradient barrier layer, and more particularly to a method for forming a gradient barrier layer with a composite structure of Ta/Ta$_x$N$_{1-x}$/TaN/Ta$_x$N$_{1-x}$/Ta (tantalum/tantalum$_x$ nitride$_{1-x}$/tantalum nitride/tantalum$_x$ nitride$_{1-x}$/tantalum) for VLSI copper back end of the line (BOEL) technology.

2. Description of the Prior Art

As feature sizes shrink, copper metallization has been proposed to answer the need of high performance and reliable interconnect for high-density integrated circuits since copper has improved stress and electromigration properties and reduced resistivity over the aluminum. However, copper readily diffuses through many materials, including both metals and dielectrics, potentially affecting dielectric constants of insulating material. For example, copper diffusion into the inter-meal dielectric (IMD) such as silicon oxide results in current leakage between adjacent lines and degradation of inter-level dielectric (ILD) breakdown field. Therefore, difficulties with forming copper interconnects have lead to the development of barrier layers that hinder the diffusion of copper into the vulnerable regions.

Referring to FIG. 1, a copper metallization implemented in an integrated circuit technology is illustrated. A barrier layer includes tens nanometers of TaN (tantalum nitride) 108 and Ta (tantalum) 110 sandwiched in between copper layer 112 of the dual damascene structure and an inter-metal dielectric (IMD) 106 such as silicon oxide layer and electrically contacted a copper structure 102 within a substrate 100. In general, the inter-metal dielectric layer 106 is formed on a silicon nitride layer 104 which overlies on the substrate 100 and serves as a passive layer. It is noted that TaN has been proposed as a good copper diffusion barrier and the adhesion of TaN to insulators is adequate, while Ta adheres poorly to oxide-like dielectric but acts better for copper seed formation. Thus, the Ta layer is typically formed on the TaN layer to enhance the adhesion of copper to TaN. In the conventional copper interconnect technology, when oxide-like materials act as the inter-mental dielectric, the adhesion of TaN layer 108 of the barrier layer to copper 102 isn't an issue. Therefore, the conventional barrier layer used in copper back end of the line (BOEL) technology is mainly for preventing copper out-diffusion from the structure 102 and 112 as depicted Arrows.

However, in the new low-k inter-metal dielectric (IMD) material systems, due to the larger thermal expansion coefficients of low-k materials 210 and the poor adhesion of TaN 108 and Cu landing pad 102, the interface 212 of TaN and Cu (108/102) becomes weak and very easy to separate, as shown in FIG. 2. Moreover, the TaN is more brittle and easy to crack. These cause the interconnection open issue and even serious fails in reliability tests such as thermal cycle test (TCT) and stress migration (SM). Therefore, approaches to the adhesion problem induced in the low-k dielectric material systems are prosperously progressing, and the argon (Ar) pre-clean technique is one of many.

The Ar-preclean process has been implemented to removed TaN at via bottom to make Ta film directly contact with Cu surface to increase the adhesion strength. However, due to the TaN layer at the via bottom is extremely thin, the Ar-preclean process margin is very difficult to control. Many side effects, such as micro-trenches 310, materials re-deposition on via sidewall 320, barrier thinning in trench bottom 330, are created and induce more reliability issue as depicted in FIG. 3. Micro-trenches 310 are created due to unevenly over etched. Original via bottom material even including copper residue is re-deposited on via sidewall or diffuses into the low-k dielectric that causes the increase in possibility of electrically discontinuity and changes the characteristic of the low-k dielectric. When the via bottom portion of the TaN layer 108 is removed, a partial of TaN layer 108 at trench bottom is also removed resulting in barrier thinning problem or, even worse, no TaN layer reserved, as respectively indicated by reference numbers 330 and 340.

In view of the prior art described, it is a desire to provide a barrier layer with a low diffusion coefficient for metal conductive layers, excellent adhesion and more tensile properties, and more uniform step coverage characteristic.

SUMMARY OF THE INVENTION

The present invention is directed to a method for forming a gradient barrier layer. The gradient barrier with a composite structure of metal/metal salt of different composition/metal such as Ta/Ta$_x$N$_{1-x}$/TaN/Ta$_x$N$_{1-x}$/Ta (tantalum/tantalum$_x$ nitride$_{1-x}$/tantalum nitride/tantalum$_x$ nitride$_{1-x}$/tantalum) is proposed to replace the conventional barrier for copper metallization. The gradient barrier can be formed in a chemical vapor deposition (CVD) process or a multi-target physical vapor deposition (PVD) process. For CVD process, using the characteristics of well-controlled reaction gas injection, the ratio of tantalum (Ta) and nitrogen (N) can be modulated gradually to form the gradient barrier. For the multi-target PVD process, the gradient barrier is formed by depositing multi-layers of different composition Ta$_x$N$_{1-x}$ films. After subsequent thermal cycle processes such as metal alloy, the inter-layer diffusion occurs and a more smooth distribution of Ta and N is achieved for the gradient barrier. The advantages of forming the gradient barrier include a well-controlled process, a strong adhesion between via and landing metal, more uniform step coverage, and less brittle to reduce crack It is another object of this invention that a method for forming a gradient barrier, which provides a good nucleation surface for supporting deposition of copper in an overlying copper layer, is provided.

It is a further object of this invention that a method for forming a gradient barrier layer with excellent barrier properties to prevent copper out-diffusion is provided.

It is another further object of this invention that a method for in-situ forming a gradient barrier with a composite structure of Ta/Ta$_x$N$_{1-x}$/TaN/Ta$_x$N$_{1-x}$/Ta (tantalum/tantalum$_x$ nitride$_{1-x}$/tantalum nitride/tantalum$_x$ nitride$_{1-x}$/tantalum) is provided.

In accordance with the present invention, in one embodiment, a gradient barrier structure comprises a first metal layer, a plurality of layers of a metal salt with different composition, and a second metal layer. The first and the second metal layer can be selected from the group comprising of tantalum, titanium, and tungsten layer. The first and the second metal layer are tantalum layers, and the plurality of layers of the metal salt includes a plurality of Ta$_x$N$_{1-x}$ layers, wherein x varies in the range between about 0.5 and 1. The Ta$_x$N$_{1-x}$ layers comprises a plurality of Ta$_{x1}$N$_{1-x1}$ layers, a TaN (tantalum nitride) layer, and a plurality of $Ta_{x2}N_{1-x2}$ layer, wherein the x1 is decreasing from about 1 to 0.5, and the x2 is increasing from about 0.5 to 1. The total thickness of the first tantalum layer and the $Ta_{x1}N_{1-x1}$ layers is between 10 and 100 angstroms. The TaN layer has a thickness between 100 and 200 angstroms. The total thickness of the second tantalum layer and the $Ta_{x2}N_{1-x2}$ layers is between 100 and 200 angstroms.

In accordance with the present invention, in another embodiment, a method for forming a gradient barrier on a substrate is also provided. The method comprises steps of forming a first metal layer on the substrate, forming a plurality of layers of a metal salt with different composition on the first metal layer, and forming a second metal layer on the plurality of layers of the metal salt with different composition. By introducing a first reaction gas in a chemical vapor deposition process, the first metal layer is formed. Then, by introducing a second reaction gas of varying flow rates to react with the first reaction gas, the plurality of layers of the metal salt with different composition is formed. Next, by stopping the introduction of the second reaction gas, the second metal is formed. The method further comprises a step of performing a thermal cycle process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

Figure 1:
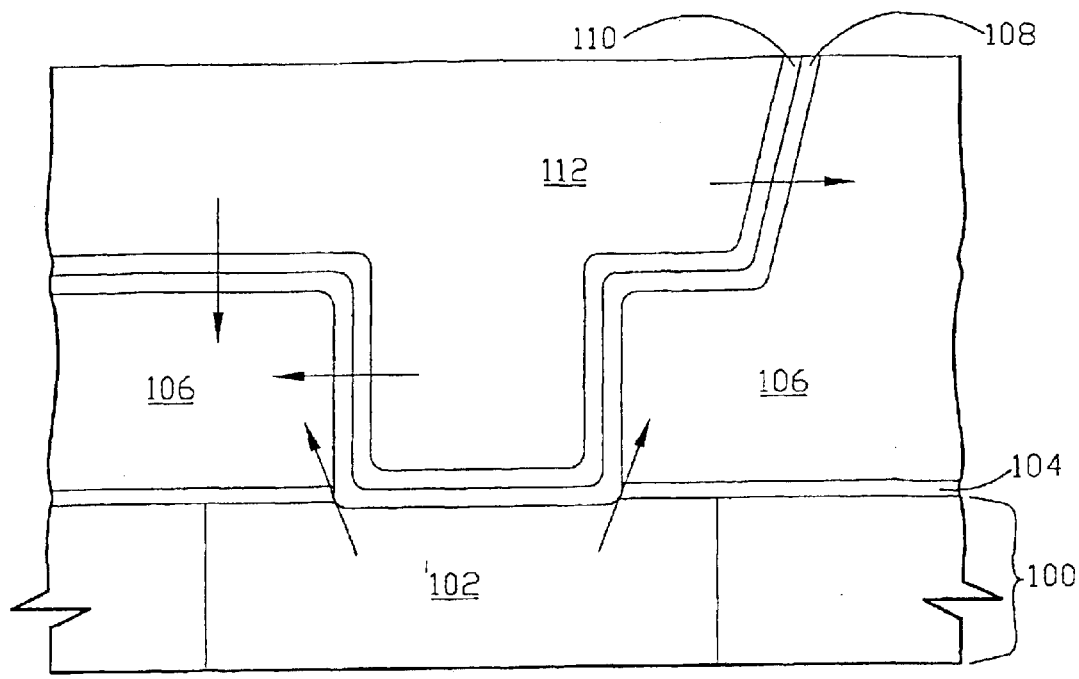
FIG. 1 is a schematic cross-section view of the conventional barrier for preventing copper diffusion.
Figure 2:
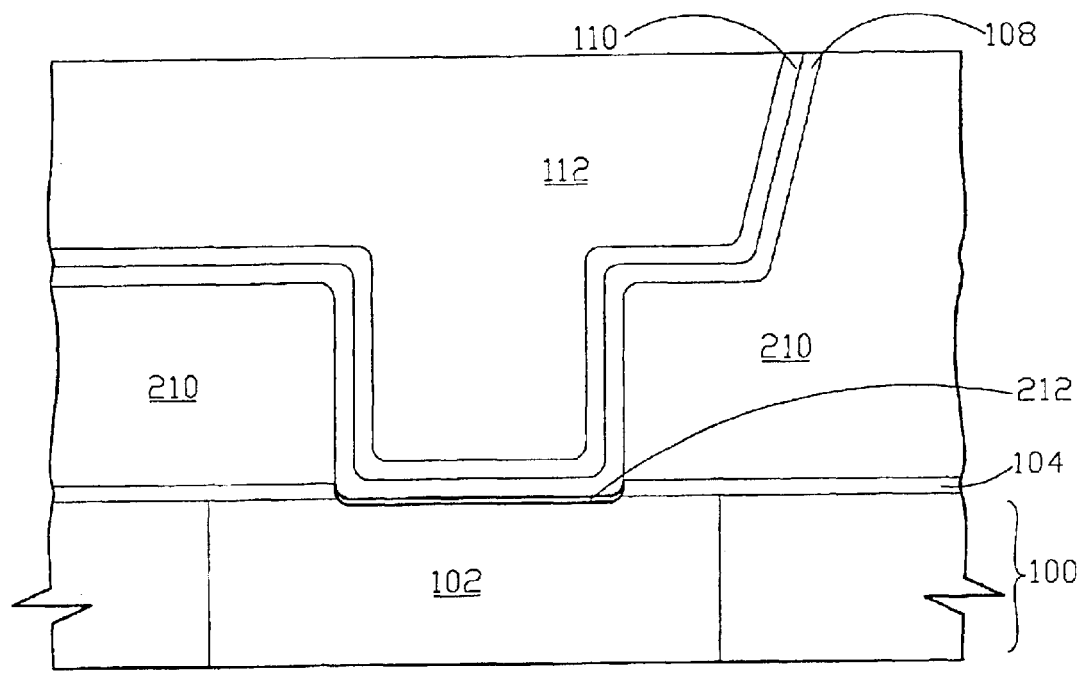
FIG. 2 is a schematic cross-sectional view of the adhesion problem of the conventional barrier at via bottom and the landing metal in prior art.
Figure 3:
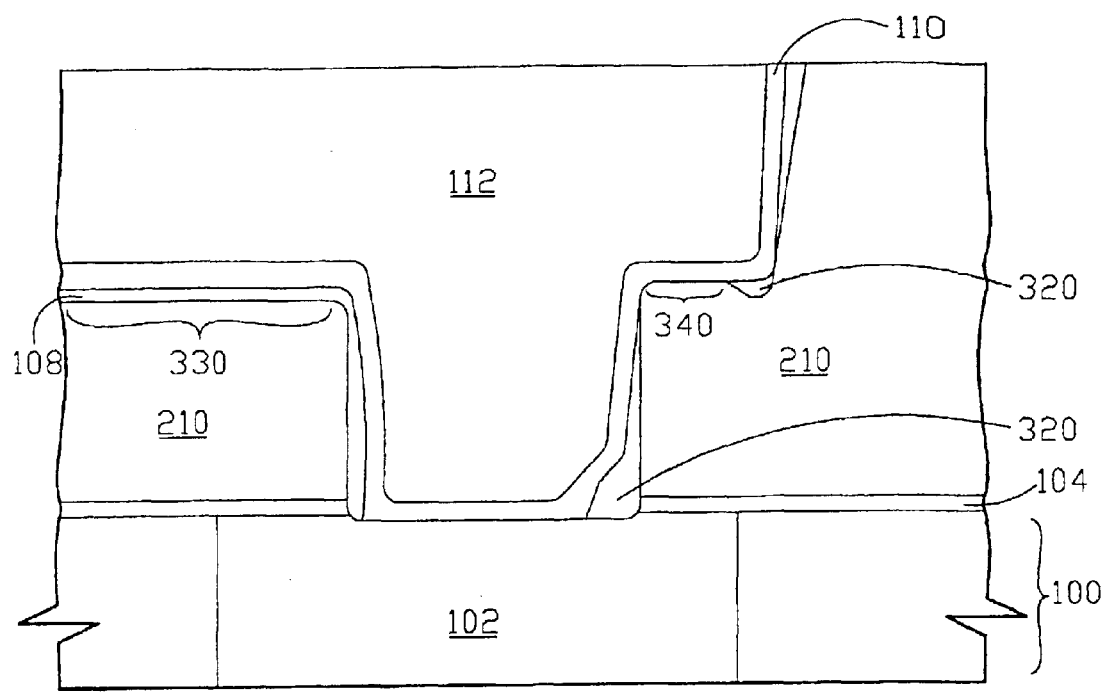
FIG. 3 is a schematic cross-sectional view of showing side effects occurred in the formation of a barrier by use of the Ar-preclean technique in the prior art.
Figure 4A:
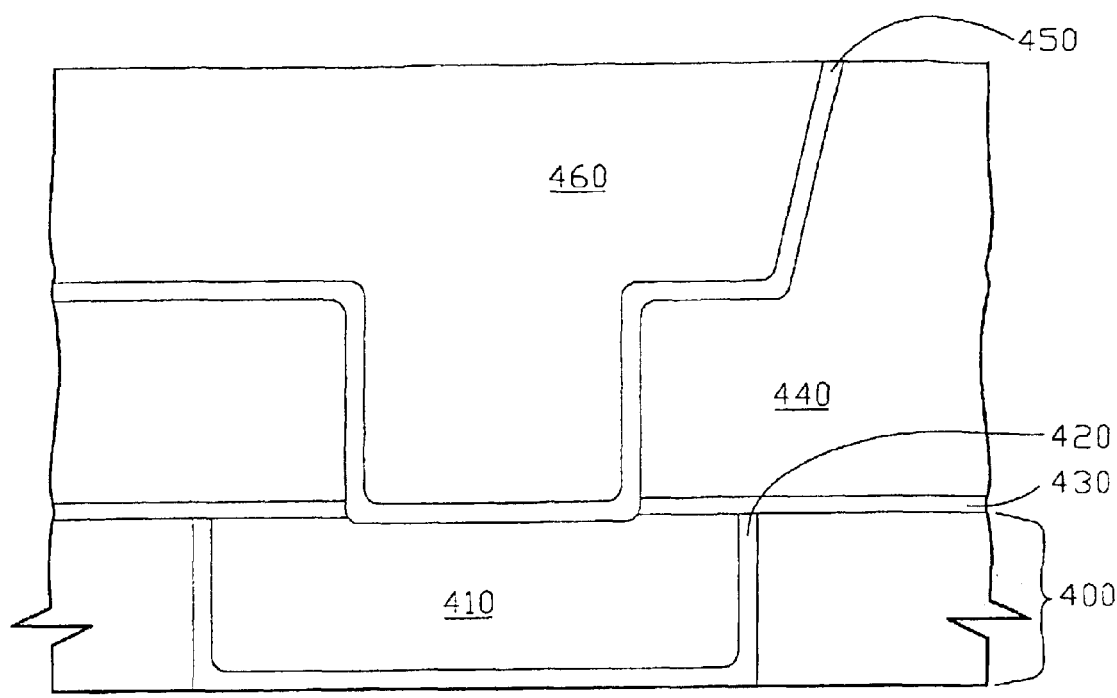
FIGS. 4A and 4B are a schematic cross-sectional view of forming the gradient barrier and the structure composition of the gradient barrier in one embodiment in accordance with the present invention.

Referring to FIG. 4A, in one embodiment, a gradient barrier for integrated circuit metallization processes is disclosed. The key aspect of the present invention is that the gradient barrier with a composite structure of metal/metal salt of different composition/metal such as $Ta/Ta_xN_{1-x}/TaN/Ta_xN_{1-x}/Ta$ (tantalum/ $tantalum_x$ $nitride_{1-x}$/tantalum nitride/ $tantalum_x$ $nitride_{1-x}$/tantalum) is proposed to replace the conventional barrier for copper metallization. A substrate 400 with a conductive structure 410 is shown. The substrate 400 can be any substrate at any semiconductor processing stage such as substrate with copper landing pad 410 in the copper metallization. An optional passive layer 430 such as silicon nitride layer is formed on the substrate 400 with the copper landing pad 410 to maintain copper's electrical conductivity characteristics. The gradient barrier 450 of a dual damascene structure is formed in a dielectric layer 440 such as low-k dielectric or oxide-like dielectric. A barrier layer 420 used to prevent copper out-diffusion from the copper landing pad 410 into the dielectric layer 440 can be also formed in accordance with the present invention. A metal layer 460 is formed on the gradient barrier 450 to accomplish the dual damascene interconnect. It is noted that in this configuration the gradient barrier is effectively sandwiched between the metal layer 460 and the dielectric layer 440 and electrically connected the copper landing pad 410 to prevent out-diffusion of the metallic material.

The gradient barrier 450 is a composite structure of metal/metal salt of different composition/metal formed sequentially. The first formed metal layer, such as tantalum, titanium, and tungsten layer, is any metal layer with good adhesion to the underlying conductive structure (copper landing pad for example) and more tensile to prevent cracking in subsequent thermal cycle processes when high thermal expansion coefficient dielectric material such as low-k material serves as the inter-metal dielectric layer. The metal salt layers of different composition can be any metal salt layers with great barrier properties to prevent materials in the overlying conductive layer diffusion into the dielectric. The later formed metal can provides a good nucleation surface for supporting deposition of metallic material in the overlying conductive layer. For the great adhesion to copper, the good step coverage, the excellent copper seed formation properties, and a well-controlled process, tantalum (Ta) is proposed to serve as the first and the later formed metal, while different composition tantalum nitride layers ($Ta_xN_{1-x}$ films) sandwiched in between act as the metal salt layers to prevent copper diffusion.

Figure 4B:
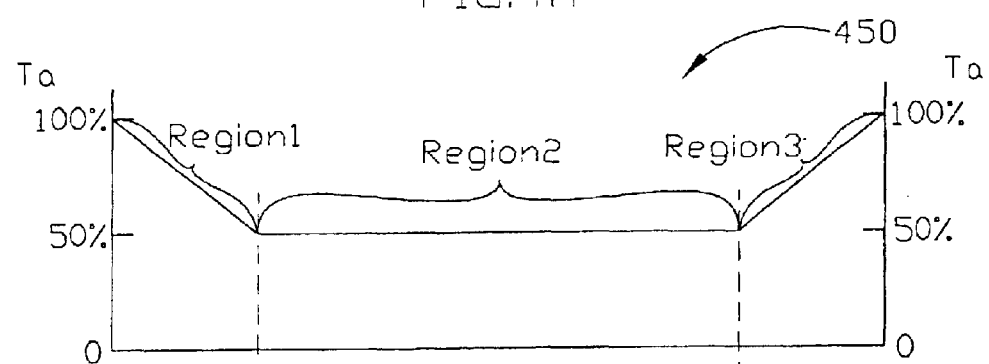
Figure 4B:
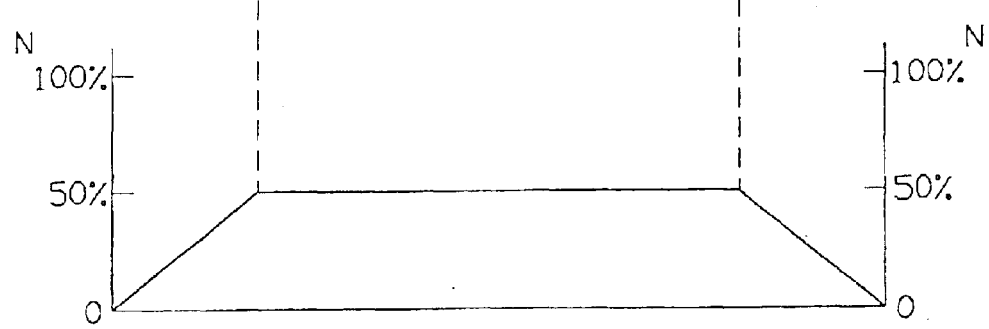

Referring to 4B, the composition of the gradient barrier 450 with $Ta/Ta_{x1}N_{1-x1}/TaN/Ta_{x2}N_{1-x2}/Ta$ (tantalum/ $tantalum_{x1}$ $nitride_{1-x1}$/tantalum nitride/ $tantalum_{x2}$ $nitride_{1-x2}$/tantalum) structure is shown. The total thickness of the Ta and $Ta_{x1}N_{1-x1}$ is in the range between about 10 and 100 angstroms depicted as Region 1 in FIG. 4B, and it is noted that the metal ingredient (Ta) of $Ta_{x1}N_{1-x1}$ is decreased as the thickness increases till reaching the ratio of Ta to N (nitrogen) is 1, that is x1 is a descent number from about 1 to 0.5. According to Region 2, the thickness of the TaN is between about 100 and 200 angstroms as depicted in FIG. 4B. The total thickness of the $Ta_{x2}N_{1-x2}$ and Ta is in the range between about 100 and 200 angstroms depicted as Region 3, and it is noted that the metal ingredient (Ta) of $Ta_{x2}N_{1-x2}$ is increased as the thickness increases from the ratio of Ta to N being 1 to almost 100% Ta being reached, that is x2 is an ascent number from about 0.5 to 1.

In accordance with the present invention, a method for forming the gradient barrier 450 is also disclosed. The gradient barrier can be formed in a chemical vapor deposition (CVD) process or a multi-target physical vapor deposition (PVD) process. For CVD process, in another embodiment, using the characteristics of well-controlled reaction gas injection, the ratio of tantalum (Ta) and nitrogen (N) can be modulated gradually to form the gradient barrier in-situ. Referring to FIG. 4A again, the method comprises a step of providing a substrate 400 having a conductive structure 410 therein and an inter-layer dielectric layer 440 thereon. An optional passive layer 430 such as silicon nitride layer is formed underlying the inter-layer dielectric layer 440 to maintain the conductive layer's 410 electrical characteristics. Then, a dual damascene topography including trenches and vias is formed by use of a conventional dual damascene process flow such as self-aligned, via-first, or trench-first.

The gradient barrier 450 with composite structure of metal/metal salt of different composition/metal is formed on the substrate 400 with the dual damascene topography by use of CVD processes. In other words, by controlling the reaction gas injection technique, a first reaction gas is injected to form a first metal layer on the inter-layer-dielectric layer 440 covering sidewalls and bottoms of the trenches and the vias. Next, by gradually changing a second reaction gas injected, a plurality of metal salt layers of different composition is formed on the first metal layer. Then, a second metal layer is formed on the plurality of metal salt layers. For example, the material for the first and the second metal layers is tantalum, and the composition of metal salt is tantalum and nitrogen. By controlling the reaction gas injection, a first Ta layer is formed on the inter-layer-dielectric layer 440. Then, by gradually changing the $N_2$ flow, a plurality of different composition $Ta_xN_{1-x}$ films is formed on the first Ta layer. Additionally, the plurality of different composition $Ta_xN_{1-x}$ films can have a similar composition as shown in FIG. 4B by gradually increasing the $N_2$ flow (Region 1), when the ratio of Ta to N reaches 1 maintaining the $N_2$ flow till achieving a desired thickness (Region 2), then gradually decreasing the $N_2$ flow to approaching zero (Region 3). Then, stopping introducing the $N_2$ flow, a second Ta layer is formed on the plurality of different composition $Ta_xN_{1-x}$ films. A conductive layer 460 such as copper is then formed on the gradient barrier 450 to accomplish the dual damascene interconnect structure. It is noted that a barrier layer 420 for preventing conductive materials out-diffusion from the conductive layer 410 into the dielectric layer 440 can be also formed in accordance with the present invention.

In a further embodiment, a gradient barrier with composite structure of metal/metal salt of different composition/metal is formed by use of PVD processes. The PVD processes include the sputter-like technique or the ion metal plasma (IMP) technique with a multi-target feature. Referring to 4C and also FIG. 4A, after the dual damascene topography is created, the gradient barrier 450 is formed by depositing multi-layers of different composition metal salt films. In other words, a first metal layer 450a is formed on the inter-layer dielectric 440. Then, a plurality of metal salt layers of different composition, such as 450b, 450c, 450d, 420e, and 450f, is formed on the first metal layer 450a. Next, a second metal layer 450g is formed on the plurality of metal salt layers. Then, a conductive layer 460 such as copper is then formed on the gradient barrier 450 to accomplish the dual damascene interconnect structure.

Figure 5A:
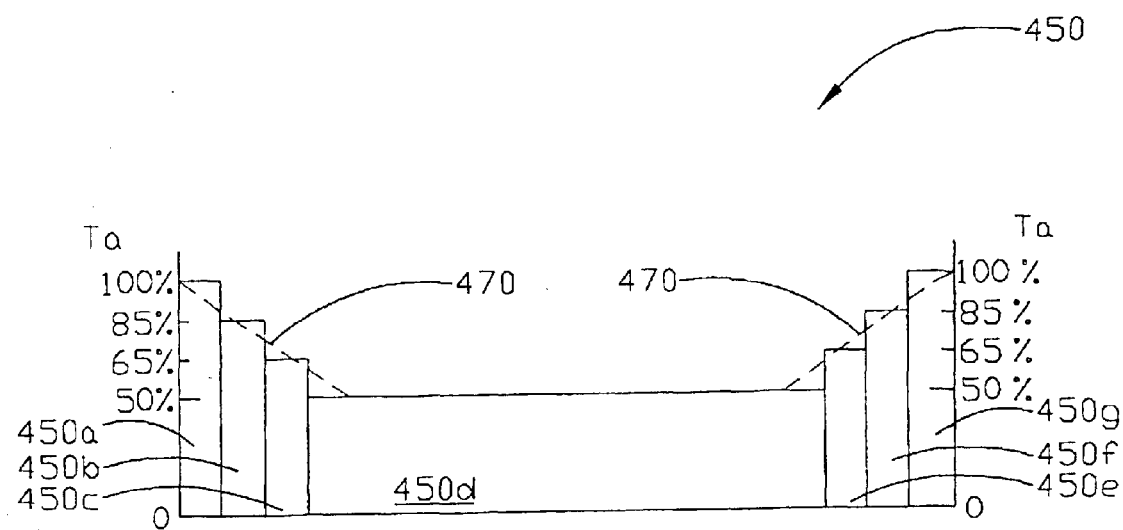
FIGS. 5A and 5B are a schematic cross-sectional view of forming the gradient barrier and a structure composition of the gradient barrier in another embodiment in accordance with the present invention.
Figure 5B:
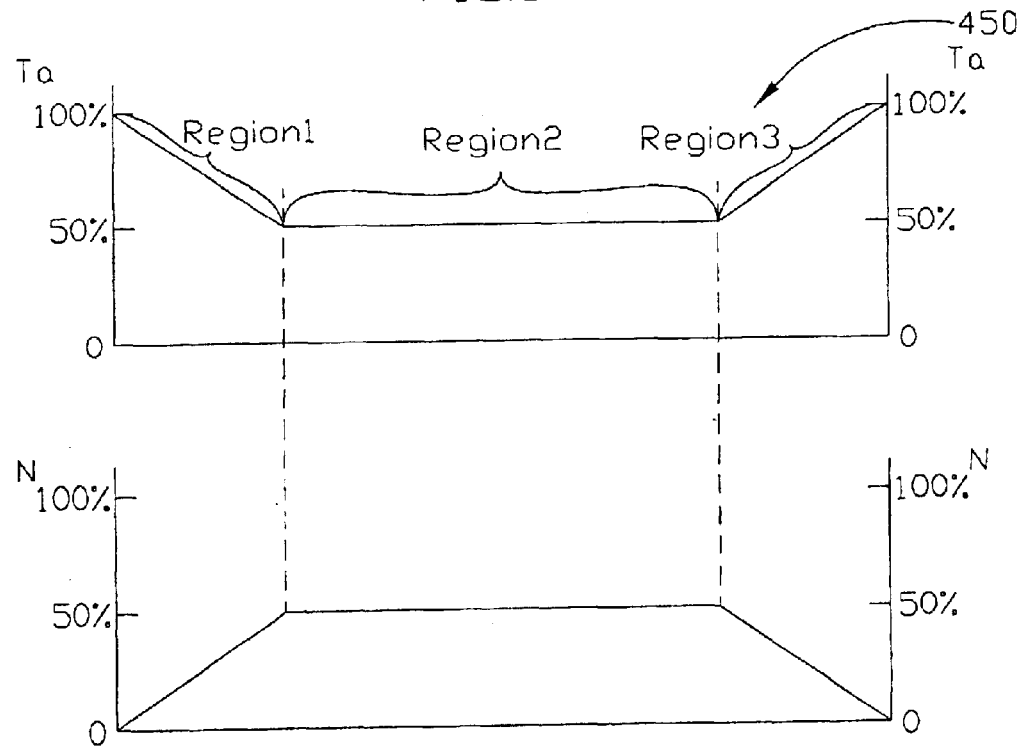

For example, the material for the first and the second metal is tantalum, and the composition of metal salt is tantalum and nitrogen. A first tantalum layer 450a is formed on the inter-layer dielectric layer 440 by using a first target (100% Ta) with the sputter deposition technique. Then, a first $Ta_xN_{1-x}$ layer 450b is formed on the first Ta layer 450a by using a second target (about 85% Ta). Subsequently, a second and a third $Ta_xN_{1-x}$ layers (about 65% and 50% Ta), 450c and 450d, are formed on the first $Ta_xN_{1-x}$ layer 450b. Then, a fourth and a fifth $Ta_xN_{1-x}$ layers with increasing Ta ingredient (such as about 65% and 85% Ta), 450e and 450f, is sequentially formed. Then, a second Ta layer 450g is formed on the fifth $Ta_xN_{1-x}$ layer 450f. After subsequent thermal cycle processes such as metal alloy, the inter-layer diffusion occurs and a more smooth distribution of Ta and N is achieved for the gradient barrier 450 indicated as dotted line 470. The gradient barrier 450 is illustrated as FIG. 5B, which presents a similar composition to FIG. 4B. It is noted that the number of different composition $Ta_xN_{1-x}$ layers is not unique and not restricted to the example.

In accordance with the present invention, the gradient barrier with a composite structure of metal/metal salt of different composition/metal such as $Ta/Ta_xN_{1-x}/TaN/Ta_xN_{1-x}/Ta$ is proposed to replace the conventional barrier for copper metallization. Therefore, the advantages of forming the gradient barrier including a well-controlled process (in-situ formation), a strong adhesion between via and landing metal, a good nucleation surface for supporting deposition of copper in an overlying copper layer, more uniform step coverage, and less brittle to reduce crack are readily achieved.

Although specific embodiments have been illustrated and described, it will be obvious to those skilled in the art that various modifications may be made without departing from what is intended to be limited solely by the appended claims.

What is claimed is:

1. A gradient barrier structure comprising sequentially:
    a first metal layer;
    a plurality of layers of metal salt with different composition on said first metal layer, said plurality of layers of metal salt with different composition comprising a plurality of $Ta_{x1}N_{1-1}$ layers, a TaN (tantalum nitride) layer, and a plurality of $Ta_{x2}N_{1-x2}$ layers, wherein said x1 is decreasing from about 1 to 0.5, and said x2 is increasing from about 0.5 to 1; and
    a second metal layer disposed on said plurality of layers of metal salt with different composition.

2. The structure according to claim 1, wherein said first metal layer is selected from the group consisting of a tantalum, titanium, and tungsten layer.

3. The structure according to claim 1, wherein said first metal layer is a tantalum layer, and said first metal layer and said $Ta_{x2}N_{1-x1}$ layers have a total thickness of between 10 and 100 angstroms.

4. The structure according to claim 1, wherein said tantalum nitride layer has a thickness between 100 and 200 angstroms.

5. The structure according to claim 1, wherein said second metal layer is a tantalum layer, and said $Ta_{x2}N_{1-x2}$ layers and said second metal layer has a total thickness between 100 and 200 angstroms.

6. The structure according to claim 1, wherein said second metal layer is selected from the group consisting of a-tantalum, titanium, and tungsten layer.

7. A gradient barrier structure comprising:
    a first metal layer;
    a plurality of layers of metal salt on said first metal layer, wherein said plurality of layers of said metal salt with different composition comprises a plurality of $Ta_{x1}N_{1-x1}$ layers, a TaN (tantalum nitride) layer, and a plurality of $Ta_{x2}N_{1-x2}$ layers, wherein said x1 is decreasing from about 1 to 0.5, and said x2 is increasing from about 0.5 to 1; and
    a second metal layer, said second metal layer being on said plurality of layers of said metal salt.

8. The structure according to claim 7, wherein said first metal layer is selected from the group consisting of a tantalum, titanium, and tungsten layer.

9. The structure according to claim 7, wherein said first metal layer is a tantalum layer, and said first metal layer and said $Ta_{x1}N_{1-x1}$ layers have a total thickness between 10 and 100 angstroms.

10. The structure according to claim 7, wherein said tantalum nitride layer has a thickness between 100 and 200 angstroms.

11. The structure according to claim 7, wherein said second metal layer is selected from the group consisting of a tantalum, titanium, and tungsten layer.

* * * * *